US008580605B2

(12) United States Patent
Heitzmann et al.

(10) Patent No.: US 8,580,605 B2
(45) Date of Patent: Nov. 12, 2013

(54) REDUCTION OF THE EFFECTS OF CAP-LIKE PROJECTIONS, DUE TO LASER ABLATION OF A METAL LEVEL BY USING A NON-CROSSLINKED LIGHT OR HEAT-CROSSLINKABLE POLYMER LAYER

(71) Applicants: Marie Heitzmann, Sinard (FR); Mohammed Benwadih, Champigny sur Marne (FR)

(72) Inventors: Marie Heitzmann, Sinard (FR); Mohammed Benwadih, Champigny sur Marne (FR)

(73) Assignee: Commissariat a l'Energie Atomique et aux Energies Alternatives (FR)

( * ) Notice: Subject to any disclaimer, the term of this patent is extended or adjusted under 35 U.S.C. 154(b) by 0 days.

(21) Appl. No.: 13/669,061

(22) Filed: Nov. 5, 2012

(65) Prior Publication Data
US 2013/0122648 A1 May 16, 2013

Related U.S. Application Data

(63) Continuation of application No. PCT/FR2011/050923, filed on Apr. 21, 2011.

(30) Foreign Application Priority Data

May 7, 2010 (FR) ...................... 10 53566

(51) Int. Cl.
*H01L 51/40* (2006.01)
(52) U.S. Cl.
USPC ..................... 438/99; 257/E23.119

(58) Field of Classification Search
USPC ..................... 438/99; 257/E23.119
See application file for complete search history.

(56) References Cited

U.S. PATENT DOCUMENTS

| 2008/0194056 A1* | 8/2008 | Cain et al. | 438/99 |
| 2009/0061565 A1* | 3/2009 | Yang | 438/118 |
| 2010/0143840 A1* | 6/2010 | Veres et al. | 430/270.1 |

FOREIGN PATENT DOCUMENTS

WO 2006129126 A2 12/2006

OTHER PUBLICATIONS

Meixner, et al.; "Bottom Gate Organic Field Effects Transistors made by Laser Structuring"; Organic Electronics 7 (2006) 586-591.
Prasad, et al.; "Interplay Between Chemical, Thermal, and Mechanical Processes Occurring upon Laser Excitation of Poly(methyl methacrylate) and Its Role in Ablation"; J. Phys. Chem. C 2009, 113, 11491-11506.
International Search Report Application No. PCT/FR2011/050923 Completed: Aug. 5, 2011; Mailing Date: Aug. 17, 2011 3 pages.
Parashkoc, et al.; "Organic Verticle-Channel Transistors Structured Using Excimer Laser"; American Institute of Physics 2004; pp. 5751-5753.
Karnakis, et al.; "Ultrafast Laser Patterning of OLED Stacks on a Multilayered Flexible Substrate for Solid-State Lighting"; IEEE 2009; 1 page.

* cited by examiner

*Primary Examiner* — William D Coleman
*Assistant Examiner* — Christine Enad
(74) *Attorney, Agent, or Firm* — St. Onge Steward Johnston & Reens, LLC

(57) ABSTRACT

A laser-crosslinkable material appearing in non-crosslinked or partially crosslinked form is used to protect, during a laser etching, the electrodes of an organic transistor.

14 Claims, 5 Drawing Sheets

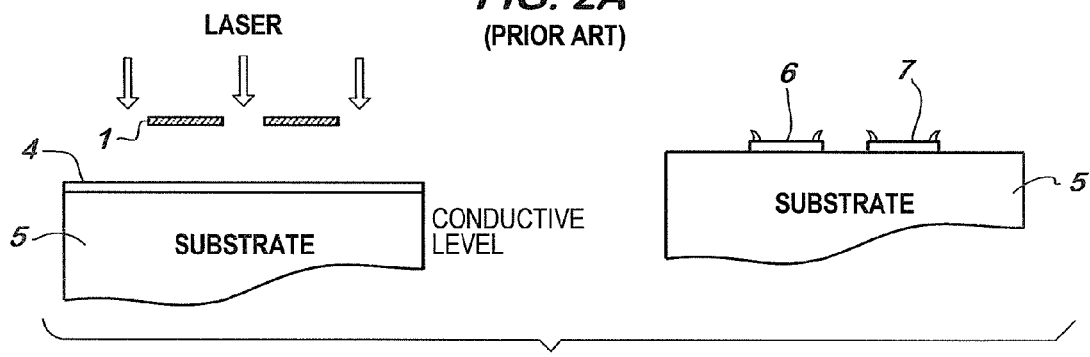
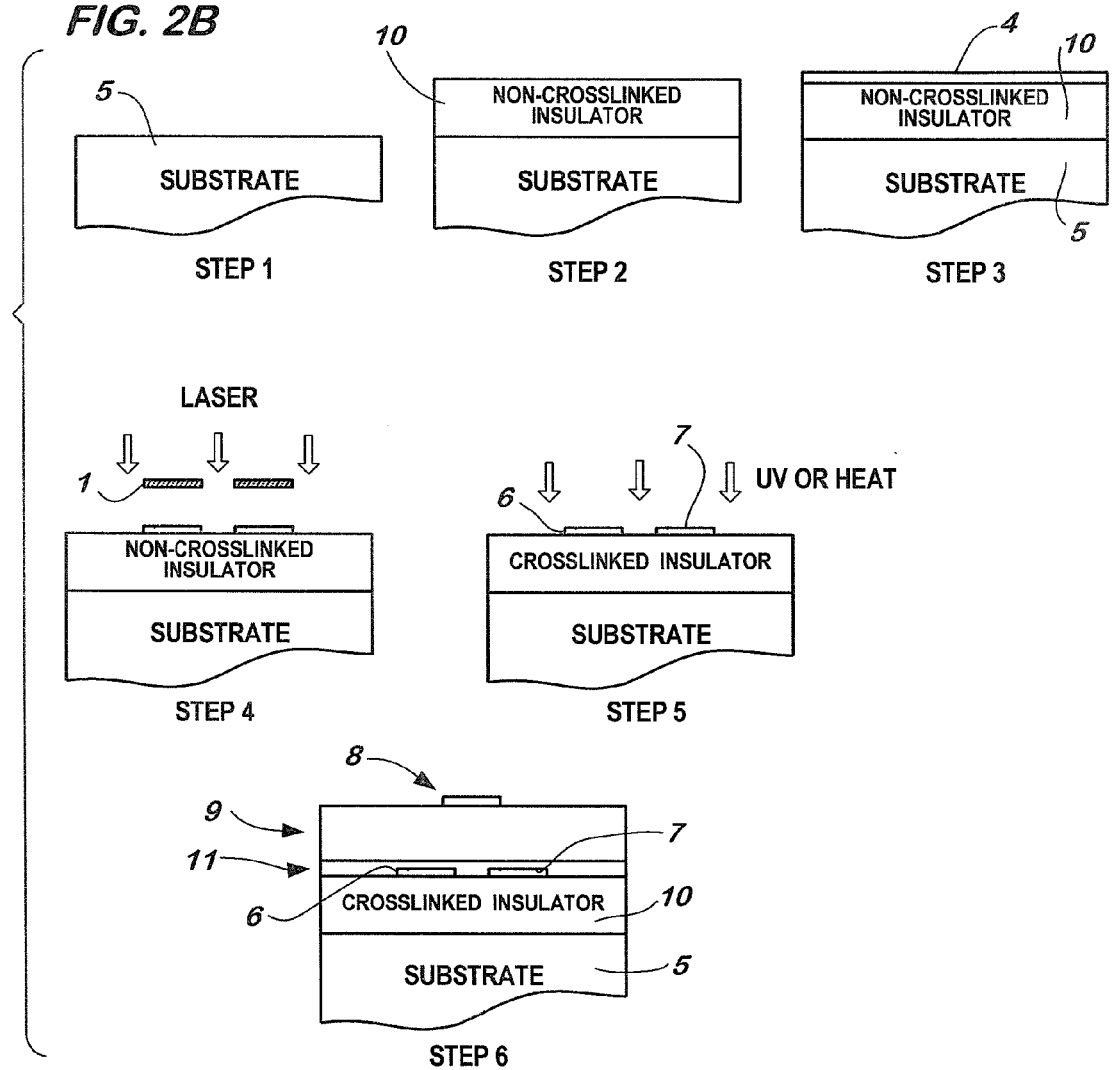

REDUCTION OF THE EFFECTS OF CAP-LIKE PROJECTIONS, DUE TO LASER ABLATION OF A METAL LEVEL BY USING A NON-CROSSLINKED LIGHT OR HEAT-CROSSLINKABLE POLYMER LAYER

FIELD OF THE INVENTION

The present disclosure relates to the field of organic electronics, and especially to the manufacturing of resistors, capacitors, diodes, transistors . . . .

In practice, it provides a solution to issues related to surface degradation in step(s) of etching of a metal level. It finds a more specific application in the step of etching by excimer-type laser ablation of the electrodes of an organic transistor.

BACKGROUND OF THE INVENTION

The excimer method, which may be implemented by means of a device illustrated in FIG. 1A, enables to structure and to pattern patterns obtained by the projection of a mask (1). The ablation of the substrate (2) is achieved by the interaction between the UV beam (3, excimer) crossing the mask (1) made of glass and aluminum and the layer surface (substrate, 2).

The excimer laser is a gas laser which emits in pulsed mode in the ultraviolet range, between 193 and 351 nanometers according to the gas mixture used. The gas mixture is formed of a rare gas G (Ar, Xe, Kr) and of a halogenated compound X ($F_2$, HCl). The excitation, be it electric or by electron beams, results in the forming of excited molecules GX* [ArF ($\lambda$=193 nm), KrF ($\lambda$=248 nm), XeCl ($\lambda$=308 nm), XeF ($\lambda$=351 nm)]. The delivered energies are on the order of one joule and the pulse durations vary from 10 to 150 nanoseconds, while the frequencies can reach one kHz. High-power excimer sources have appeared in 1992 ($P_{average}$: from 500 to 1,000 W) opening the way to their use for surface processing.

Excimer laser has specific advantages: a high photon energy (several eV) enabling to achieve photochemical effects, processings with a submicronic spatial resolution, and very limited thermal effects, a laser-to-matter coupling which is more efficient in ultraviolet than in infrared. Above 300 nm, a transport by optic fiber appears to be possible.

During the ablation, a molten bead or a cap-like metal projection (FIG. 1B) is present on the etch edges, according to the power used: a low power provides cap-like projections while a high power provides molten edges which generally have delaminated or molten dimensions greater than one micrometer. Such profiles are a great issue for the use of these patterns in the forming of organic electronic components, for which techniques of deposition of active layers having a thickness on the order of 100 nanometers are used. Depositing thin layers of 100 nanometers or less, for example semiconductors from 30 to 70 nanometers on patterns exhibiting such projections and profiles raises many issues.

This may especially cause electric leakages, step crossing difficulties, dimension losses (for example, concerning the channel width), a premature aging . . . .

Now, it has been observed that whatever the metal used (Ti, Cu, Au, Ni, Pt, . . . ), the technique of laser ablation by mask projection never leaves a perfect pattern edge. This is inherent to the method and can be explained by the fact that the heat of UVs during the "laser shooting" makes the metallization burst.

This disadvantage is a major concern in microelectronics, and especially in the forming of transistors.

Microelectronics has conventionally developed around inorganic materials such as silicon (Si) or gallium arsenide (GaAs). Another path is now explored around organic materials, such as polymers, due to the ease of their large-scale manufacturing, to their mechanical resistance, to their flexible structure, or again to the easy reprocessing. Displays based on organic diodes (OLEDs) or based on organic thin-film transistors (OTFTs) have thus been designed. Further, the use of layer deposition techniques, for example, by spin coating, inkjet, or silk-screening, is made possible by the use of soluble polymers.

However, the stacking of different organic and/or inorganic layers raises a number of issues. In particular, the design of a transistor requires two conductive levels:

In high-gate architecture (FIG. 2A), conductive level 1 (4) is deposited on the substrate (5) after which the source and drain electrodes (6, 7) are etched by different types of methods such as an excimer-type laser ablation. This step requires a very fine adjustment of the laser beam power, to decrease cap-like projections to a minimum.

In low-gate architecture (FIG. 3A), conductive level 2 (4) is deposited on the gate dielectric (9) after which the source and drain electrodes (6, 7) are etched by laser ablation. Similarly, this step requires a very fine adjustment of the laser beam power to decrease cap-like projections and the degradation of the gate dielectric to a minimum.

There thus is an obvious need to develop technical solutions enabling to minimize such effects at the edges of the etch pattern.

SUMMARY OF THE INVENTION

Thus, the provided invention enables to decrease the appearing of cap-like projections and of beads at the pattern edge, which is inherent to the laser ablation method.

Thus, the present invention is based on the use of a laser-crosslinkable material appearing in non crosslinked or partially crosslinked form to protect a metal layer intended to be etched by laser.

In other words, it relates to a method for structuring a metal layer by laser ablation or etching, according to which a protection layer is arranged at the back of the metal layer to be etched or ablated.

More specifically, the present invention aims at a method for etching a metal layer with a laser, which comprises the steps of:
deposition of a protection layer on a substrate, said layer comprising a laser-crosslinkable material and appearing in non crosslinked or partially crosslinked form;
deposition of the conductive layer on the protection layer;
laser etching of the conductive layer.

A substrate suitable for the implementation of the method according to the present invention may be a plastic substrate (PEN, PET . . . ), a plastic substrate covered with metal (Au, Al, Ag, Pd, . . . ) having a thickness ranging between 10 and 200 nanometers, or a metal surface (Au, Al, . . . ) or a conductive surface (for example, PEDOT PSS).

Characteristically, according to the present invention, the protection layer comprises or is formed of a laser-crosslinkable material appearing in non-crosslinked or partially crosslinked form. The basic principle of the present invention thus is the presence of a material capable of absorbing part of the laser power which, thereby, causes less damage to the laser-processed metal layer. Indeed, the final properties of a crosslinkable polymer depend on its crosslinking degree. A fully crosslinked polymer material will be harder than a polymer material having a few crosslink nodes, which will then have more resilient properties ("J. Phys. Chem. C 2009, 113, 11491-11506"). Thus, this resilience will enable to absorb the wave and the low crosslinking rate will make a crosslinking possible.

In other words, the present invention is based on the fact of not totally crosslinking the layer under the level to ablated. Thereby, the excess energy of the laser beam is partly absorbed by this protection layer and etch edge effects are significantly attenuated. Further, according to the power necessary for the etching, the ablation may be performed either by 1 shot at this power, or by several shots at lower powers.

Such a protection layer typically has a thickness ranging between 10 and 1,500 nanometers, and advantageously ranging between 100 and 1,000 nanometers. It may be deposited on the substrate by any technique known by those skilled in the art, for example, by spin coating.

In the context of the present invention, term "laser" (Light Amplification by Stimulated Emission of Radiation) is used to designate a device generating a radiation concentrated in a very thin monochrome light beam with a very high coherence and a highly directive power.

Such a device for example is an excimer laser which emits in the ultraviolet range (UV), with wavelengths ranging between 100 and 400 nanometers, and in particular 157, 248, 308, and 351 nm.

As known, such a device is generally used in combination with a mask to structure or to pattern patterns on the layer of interest Typically, such a device has a fluence ranging between 10 and 1,000 mJ/cm$^2$, for example, equal to 54 mJ/cm$^2$. Pulse durations may vary from 10 to 150 nanoseconds, and for example be equal to 30 ns, and the number of pulses may also be variable, typically from 1 to 10.

In the context of the present invention, phrase "laser-crosslinkable" means that said material is capable of forming a three-dimensional network by creation of links between macromolecular chains under the action of the laser. In practice, the material is thus partially or totally crosslinked under the action of UV rays or of the heat associated with the laser, according to whether it is light- or heat-crosslinkable, respectively.

In the case where, after the exposure to the laser, the material is only partially crosslinked, the crosslinking may be continued by insolation, especially with a UV lamp (for a few minutes, of a power of a few hundreds of watts) to result in its full light crosslinking or heat crosslinking.

Typically, the laser-crosslinkable material used in the context of the present invention is a polymer.

Such a material may also have other specific properties adapted to the envisaged application.

In the context of organic transistor manufacturing, the laser-crosslinkable material appearing in non-crosslinked or partially crosslinked form is advantageously electrically insulating. It is further advantageous for the crosslinkable polymer to have a good electric compatibility with the semiconductor. To achieve this, a material having a permittivity smaller than 5 is preferred.

Such a material is for example selected from the group comprising: polyacrylates, epoxy resins, epoxy acrylates, polyurethanes, silicons, polyimides and copolyimides, poly(sisesquioxane)s, poly(benzocyclobutene)s, poly(vinylcinnamate)s, perfluorinated aliphatic polymers, poly(vinylphenol).

In the context of transistor manufacturing, which is a privileged application of the present invention, the step of etching of the source and drain electrodes and possibly of the gate is particularly delicate and requires implementing the method according to the invention.

Thus, the invention relates to a method for manufacturing an organic transistor, comprising the steps of:
  deposition of a protection layer on a substrate, said layer comprising a laser-crosslinkable material and appearing in non crosslinked or partially crosslinked form;
  deposition of a conductive layer intended to form the source and drain electrodes or the gate of the transistor, on the protection layer;
  laser etching of the conductive layer resulting in the forming of the source and drain electrodes or of the gate of the transistor;
  deposition of a dielectric layer;
  deposition of the gate or of the source and drain electrodes at the surface of the dielectric.

In this method, and conventionally for a transistor, a semiconductor layer is further deposited at the surface of the source and drain electrodes.

According to a specific embodiment the deposition of the gate or of the source and drain electrodes at the end of the process is performed by deposition and laser etching of a conductive layer.

According to the present invention, the dielectric layer is also formed by means of a laser-crosslinkable material appearing in non-crosslinked or partially crosslinked form. As a variation, a protection layer is also deposited between the dielectric layer and the gate or the source and drain electrodes.

The method according to the present invention enables to manufacture transistors both in high-gate and low-gate architecture. A high-gate architecture typically comprises the following succession of layers:
  a substrate;
  drain and source electrodes;
  an organic or inorganic semiconductor;
  a gate dielectric;
  a gate.

In this architecture, the protection layer is thus to be interposed between the substrate and the metal layer used to create the drain and source electrodes, and/or also between the gate and its gate dielectric. It should be noted that, in this last case, the dielectric may behave as a protection layer.

To manufacture a transistor in high-gate architecture by means of the method according to the present invention, the semiconductor layer is deposited after the laser etching of the source and drain electrodes and before the deposition of the dielectric layer.

In this architecture, the polymer is advantageously electrically insulating to avoid disturbing the semiconductor layer deposited above (in the case of the source and of the drain) or under (in the case of the gate). It is advantageously selected from the group comprising: polyacrylates, epoxy resins, epoxy acrylates, polyurethanes, and silicons.

The present invention thus enables to obtain a high-gate architecture organic transistor comprising the following structure:
  a substrate;
  a layer comprising a material which is at least partially crosslinked;
  source and drain electrodes;
  an organic or inorganic semiconductor;
  a dielectric layer;
  a gate.

As mentioned hereabove, a layer comprising an at least partially crosslinked material may also be present between the dielectric layer and the gate.

According to another aspect, the method according to the invention enables to manufacture an organic transistor in low-gate architecture.

A low-gate architecture conventionally comprises the following succession of layers:
- a substrate;
- a gate;
- a gate dielectric;
- drain and source electrodes;
- an organic or inorganic semiconductor.

To manufacture a transistor in low-gate architecture by means of the method according to the invention, the semiconductor layer is deposited after the deposition of the source and drain electrodes.

According to the invention, a protection layer is thus added between the substrate and the gate.

Advantageously, the dielectric layer is formed by means of a laser-crosslinkable material appearing in non-crosslinked or partially crosslinked form.

As a variation, a protection layer is added between the dielectric layer and the drain and source electrodes.

In this architecture, the polymer is advantageously selected from the group comprising: polyimides and copolyimides, poly(sisesquioxane)s, poly(benzocyclobutene)s, poly-(vinylcinnamate)s, perfluorinated aliphatic polymers, poly(vinylphenol), and poly-(acrylate)s.

The present invention thus enables to obtain a low-gate architecture organic transistor having the following structure:
- a substrate;
- a layer comprising a material which is at least partially crosslinked;
- a gate;
- a dielectric layer;
- source and drain electrodes;
- an organic or inorganic semiconductor.

As mentioned hereabove, a layer comprising an at least partially crosslinked material may also be present between the dielectric layer and the source and drain electrodes.

In other words, the use of a laser-crosslinkable material appearing in non-crosslinked or partially crosslinked form to protect a metal layer from laser etching, in the context of the manufacturing of an organic transistor, may take several forms:

For a transistor in high-gate architecture:
- a layer inserted between the substrate and the source and drain electrodes; and/or
- the dielectric layer under the gate or a layer inserted between the dielectric and the gate.

For a transistor in low-gate architecture:
- a layer inserted between the substrate and the gate; and/or
- the dielectric layer under the source and drain electrodes or
  - a layer inserted between the dielectric and the source and drain electrodes.

The present invention undeniably provides the positive effect of the presence of a crosslinkable material, which is not crosslinked or only partially crosslinked, placed under a metal layer to be processed by laser: a significant decrease of cap-like projections and molten edges, as well as an improvement of the electric characteristics can be observed.

The foregoing and other features and advantages of the present invention will be discussed in the following non-limiting description of the following embodiments in connection with the accompanying drawings.

BRIEF DESCRIPTION OF THE DRAWINGS

FIG. 2 shows a diagram of a high-gate architecture according to prior art (A) or according to the invention (B).

DETAILED DESCRIPTION OF THE INVENTION

Figure 1A:
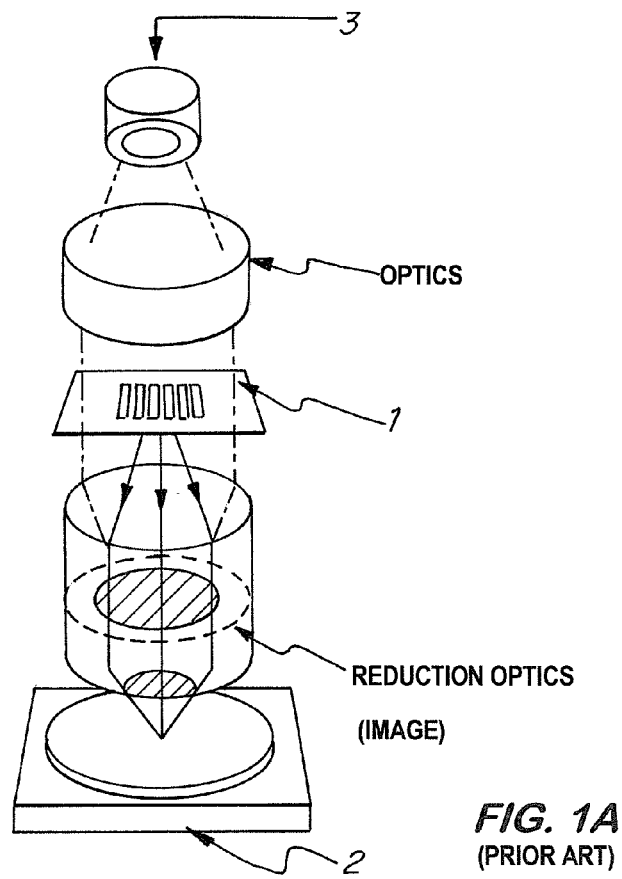
FIG. 1 shows a device for implementing the excimer method (A) and the disadvantages observed at the etching level (B).
Figure 1B:
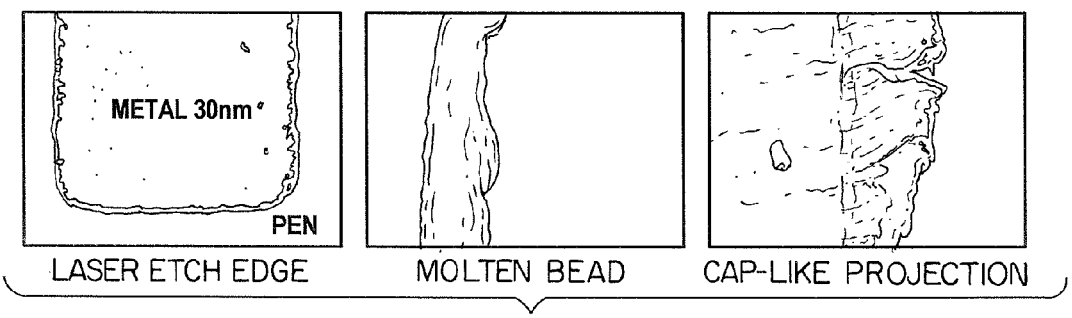

1/High-Gate Architecture:

The implementation of the present invention in the context of a high-gate architecture is illustrated in FIG. 2B. It is mainly based on the deposition of a non-crosslinked or partially crosslinked insulating polymer (10), which is thus crosslinkable, between the substrate (5) and the conductive level (4).

a/Insulating Crosslinkable Polymer:

The insulating crosslinkable polymer, capable of being used in high-gate architecture, may be selected from the following list:
- polyacrylates;
- epoxy resins;
- epoxy acrylates;
- polyurethanes;
- silicons.

In this architecture, the insulator (10) enables, if it is non-crosslinked or partially crosslinked, to decrease cap-like projections in the step of ablation of the upper layer (4). It must be electrically insulating to avoid disturbing the semiconductor layer (11) deposited above.

b/Method for Manufacturing the High-Gate Architecture:

Step 1: substrate (5)

Step 2: deposition of the non-crosslinked insulator (10) on the substrate (5)

Step 3: deposition of a conductive layer (4) over the entire surface

Step 4: etching by laser ablation of the conductive layer (4) through a mask (1) resulting in the forming of the source and drain electrodes (6, 7)

Step 5: heat or light crosslinking of the insulator (10)

Step 6: obtaining of an organic field-effect transistor by successive deposition of a semiconductor (11), of a dielectric (9), and of a gate (8)

Figure 3A:
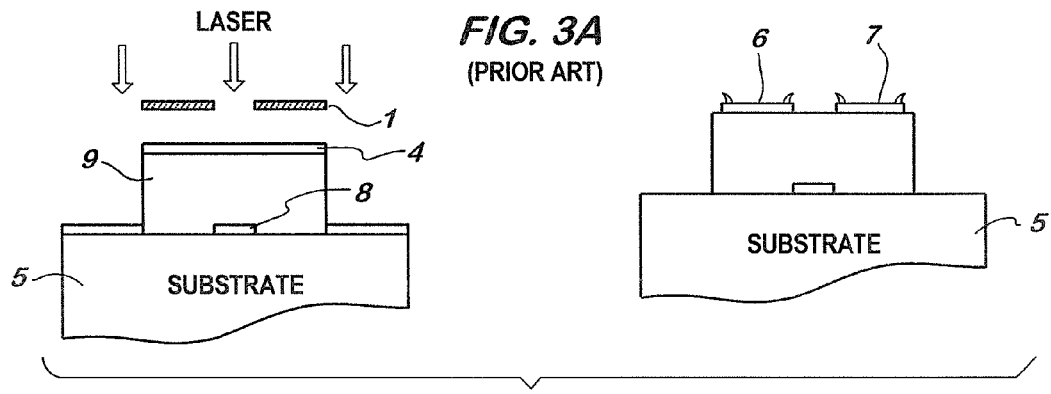
FIG. 3 shows a diagram of a low-gate architecture according to prior art (A) or according to the invention (B and C).
Figure 3B:
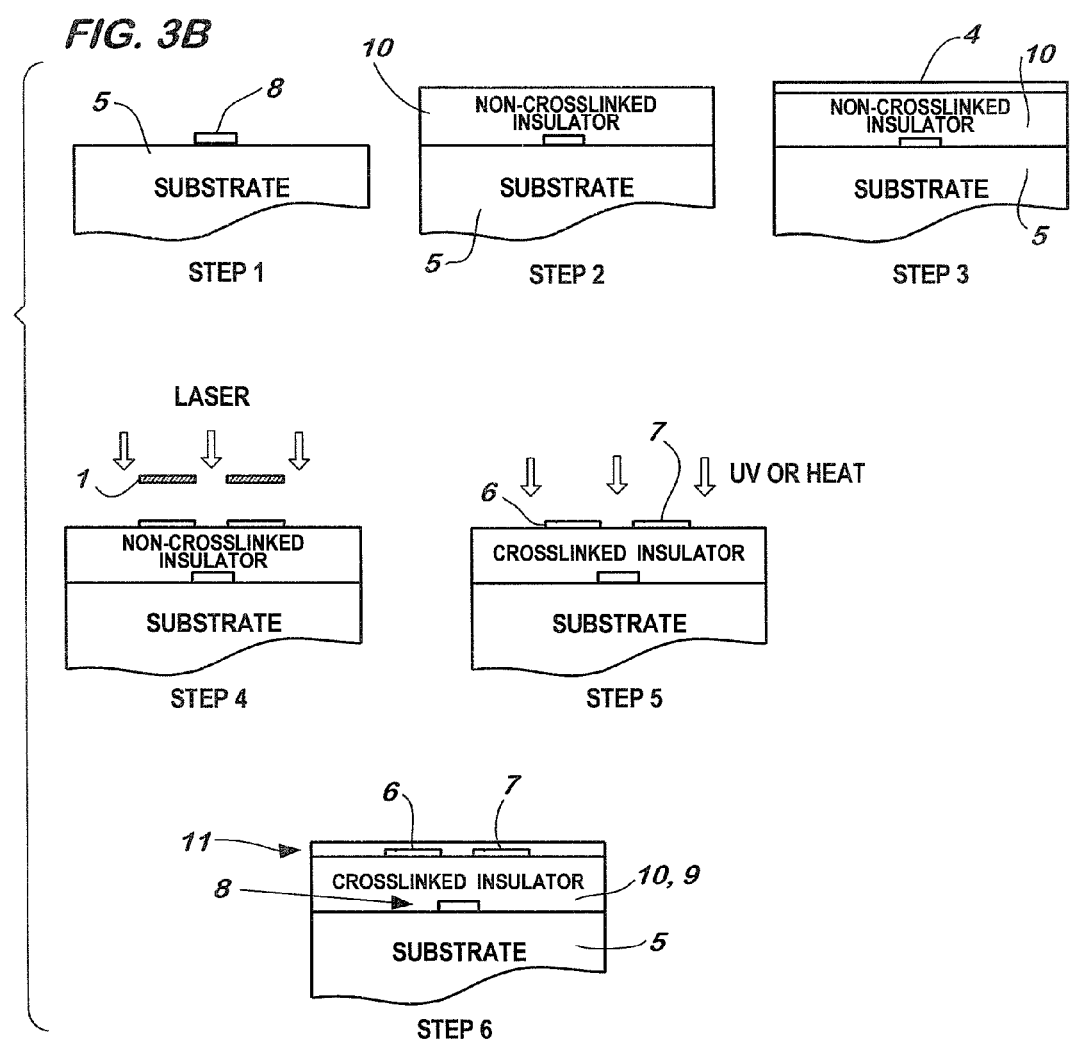
Figure 3C:
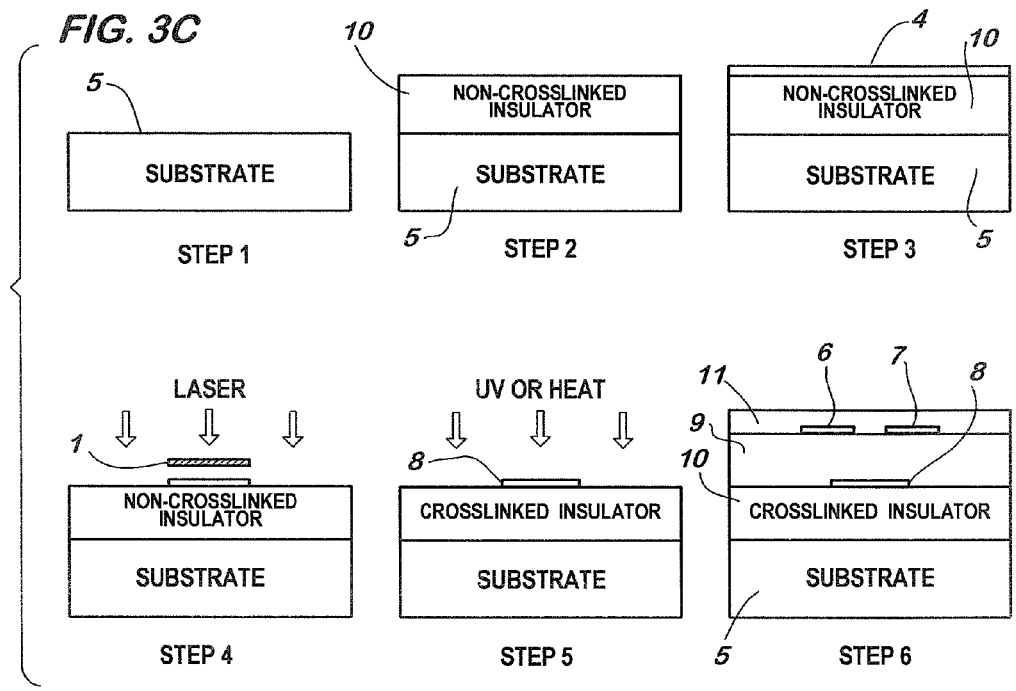

2/Low-Gate Architecture:

The implementation of the present invention in the context of a low-gate architecture is illustrated in FIGS. 3B and 3C. It is mainly based on the deposition of a non-crosslinked or partially crosslinked insulating polymer (10), which is thus crosslinkable, between the substrate (5) and the conductive level (4).

a/Dielectric Crosslinkable Polymer:

The dielectric crosslinkable polymer (10), capable of being used in low-gate architecture, may be selected from the following list: (A. Fachetti et al. Adv Mater, 2005, 17, p 1705):

| Dielectric polymer family (dielectric constant ≤3) | literature examples |
|---|---|
| Polyimides and copolyimides<br>Heat- and/or light-crosslinkable | K. Sim et al. Organic Electronics. 2009, 10, p 506<br>Mokhtari et al. Eur Polym J. 2008, 44, p 832 |
| Poly(sisesquioxane)s<br>Heat-crosslinkable | Z. Bao et al. Adv Funct Mater. 2002, 12, p 526 |
| Poly(benzocyclobutene)s<br>Heat-crosslinkable | L. L. Chua et al. Appl Phys Lett. 2004, 84, p 3400 |

-continued

| Dielectric polymer family (dielectric constant ≤3) | literature examples |
|---|---|
| Poly(vinylcinnamate)s<br>Light-crosslinkable | 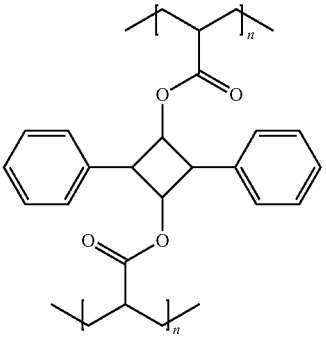<br>J. H. Bae et al. Japan J Appl Phys. 2007, 46, p 385 |
| Perfluorinated aliphatic polymers<br>Heat-crosslinkable<br>Poly(vinylphenol)<br>Heat-crosslinkable<br>Poly(acrylate)s<br>Heat-crosslinkable | Cytop, Teflon AF<br>W. L. Kalb et al. Appl Phys Lett. 1998, 73, p 108<br>PVP et agent réticulant à base de mélamine<br>C. J. Drury et al. Appl Phys Lett. 1998, 73, p 108<br>Poly(4-vinylphenol-co-2-hydroxyethylmethacrylate)<br>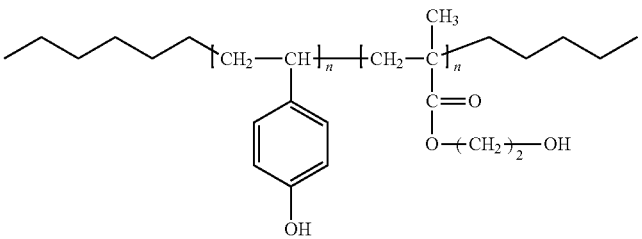<br>H. Klauk et al. J Appl Phys. 2002, 92, 5259 |

It for example is a light-crosslinkable organic dielectric, and more specifically an epoxy-type resin. It is a mixture of 49.5% by weight of poly(4-vinylphenol) (PVP), of 49.5% by weight of triglycidyl trimethylolpropane ether, of 0.5% by weight of benzoyl peroxide, and of 0.5% by weight of triphenylsulfonium triflate.

This mixture is diluted at 10% by weight in cyclohexanone and deposited by silkscreening or spun on the substrate (5). The obtained film is annealed at 100° C. on a heating plate for 5 minutes to evaporate the residual solvents of the thin polymer layer.

This dielectric (10) is crosslinked by application of a UV dose, for example, in the following conditions:
lamp power=600 W;
10 min of insolation.

b/Method for Manufacturing a Transistor in Low-Gate Architecture:

Step 1: etching of metal level 1 by photolithography or laser ablation to create the gate (8). Etch edges have little impact at the gate level on the electric properties of the transistor, the gate being much wider than the channel, and cap-like projection effects then are located outside of the channel. However, the method according to the invention may also be implemented to etch the gate (8) by interposing, between the substrate (5) and metal level 1, a crosslinkable polymer in the same conditions as described hereafter for the source and drain etching.

Step 2: spin coating of the above-described epoxy-type dielectric (10), 5-min anneal at 100° C. on a PEN/Au substrate (5) (30 nm); dielectric thickness of approximately 800 nanometers Step 3: PVD of a gold conductive layer (4) (30 nm) over the entire surface Step 4: excimer laser ablation (fluence=54 mJ/cm$^2$, λ=248 nm, 1 30-ns pulse) of the conductive layer (4), to create the source and drain electrodes (6, 7)

Step 5: heat or light crosslinking of the dielectric polymer, more specifically, crosslinking by insolation (UV lamp, 10 min, 600 W)

Step 6: deposition of a P-type semiconductor (11), for example, modified pentacene.

After this, encapsulation by a fluorinated aliphatic polymer dielectric.

According to FIG. 3C, a protection layer (10) is further deposited on the substrate (5) to protect the gate (8) from laser ablation.

c/Comparison of Two Samples A and B:

For comparison, the method discussed hereabove at section b/ has been implemented on two samples A and B. Sample B has been strictly submitted to steps 1 to 6, with a crosslinking by insolation (UV lamp, 10 min, 600 W) at step 5, that is, after the laser ablation. Sample A has been submitted to such a UV lamp insolation (10 min, 600 W) after step 2, that is, before the laser ablation. The major difference between samples A and B thus is that the crosslinkable polymer (10) is crosslinked before or after the laser ablation of the metal level (4), respectively.

Figure 4:
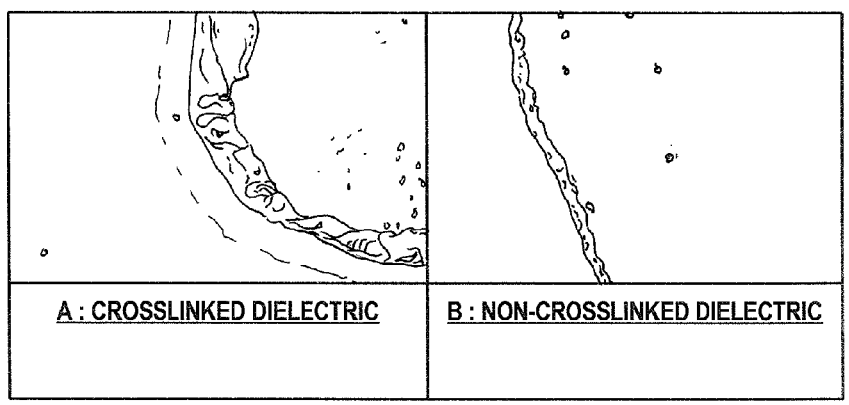
FIG. 4 corresponds to SEM observations of a gold layer of 30 nanometers ablated by the excimer-type laser method with the same fluence (54 mJ/cm$^2$): comparison between a totally crosslinked dielectric (A) and the same non-crosslinked dielectric (B).
Figure 5:
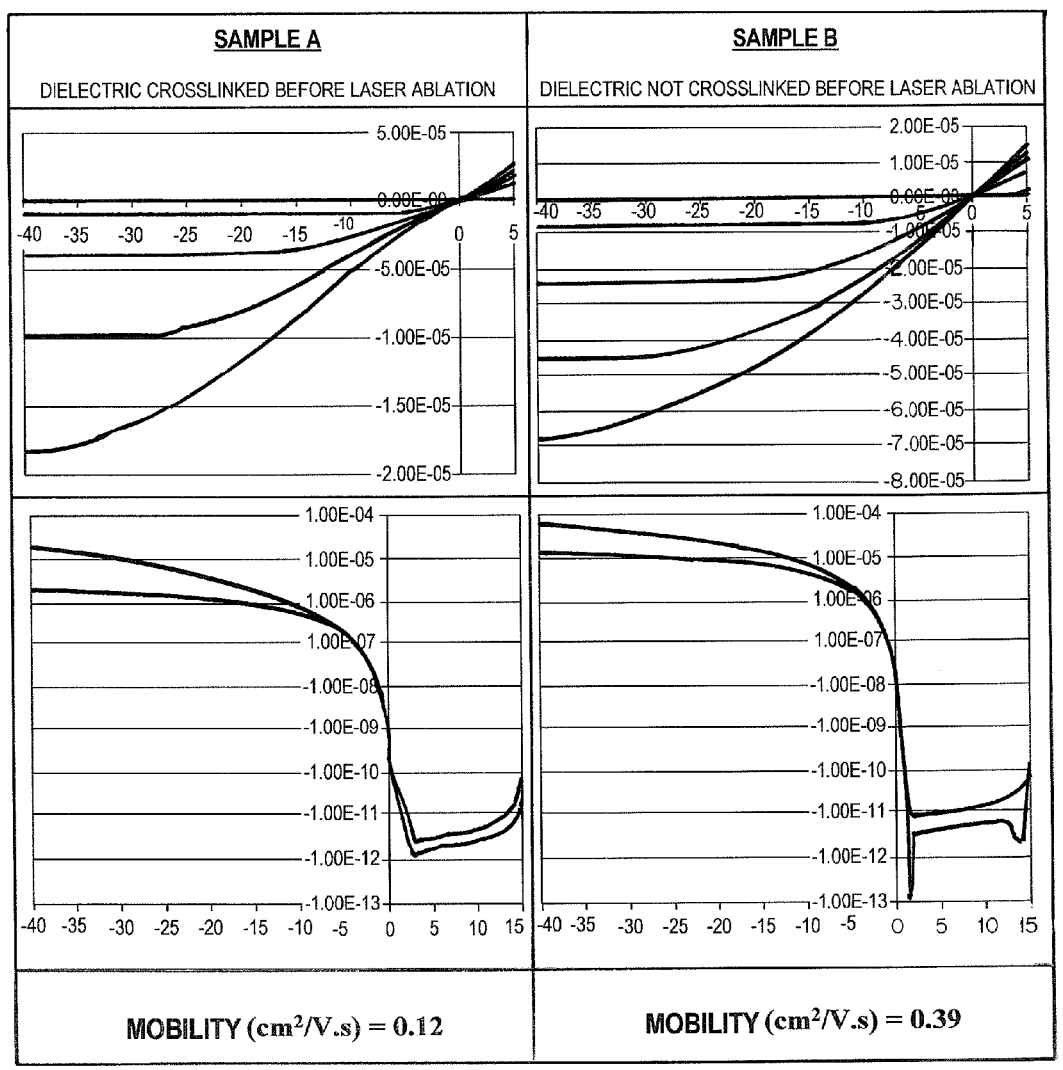
FIG. 5 illustrates the electric results obtained with two organic transistors in low-gate architecture respectively originating from samples A and B.

The characteristics of the two samples are illustrated in FIGS. 4 and 5.

FIG. 4 reveals, for the crosslinked dielectric (A), the significant presence of cap-like projections and of molten metal on the ablated upper layer. Conversely, in the case of the non-crosslinked dielectric (B), a significant decrease of cap-like projections and molten metal on the ablated upper layer can be observed.

FIG. 5 illustrates the fact that in terms of electric characteristics, sample B is much better than sample A. Indeed, the ID-versus-VD curves of sample B reveal a very good contact and a good electron injection between the two source and drain electrodes. Due to this method, the electron injection into the channel is thus improved, as well as the electron mobility. The current is then greater in open state.

What is claimed is:

1. A method for manufacturing an organic transistor, comprising the steps of:
   depositing a protection layer on a substrate, said layer comprising a laser-crosslinkable material appearing in non-crosslinked form;
   depositing a conductive layer intended to form source and drain electrodes or a gate of the transistor, on the protection layer;
   laser etching the conductive layer resulting in the forming of the source and drain electrodes or the gate of the transistor, wherein said protection layer is adapted to absorb at least a portion of excess energy of a laser beam used for said laser etching step;
   crosslinking, subsequent to said laser etching step, the protection layer;
   depositing a dielectric layer;
   depositing the gate or the source and drain electrodes,
   wherein a semiconductor layer is deposited at a surface of the source and drain electrodes.

2. The organic transistor manufacturing method of claim 1, wherein the step of depositing the gate or the source and drain electrodes is performed by depositing and laser etching a conductive layer.

3. The organic transistor manufacturing method of claim 1, wherein the dielectric layer is formed by means of a laser-crosslinkable material appearing in non-crosslinked form.

4. The organic transistor manufacturing method of claim 1, wherein a protection layer is further deposited between the dielectric layer and the gate or the source and drain electrodes.

5. The organic transistor manufacturing method of claim 1, wherein the organic transistor is a transistor in high-gate architecture and wherein the semiconductor layer is deposited between the laser etching of the source and drain electrodes and the deposition of the dielectric layer.

6. The organic transistor manufacturing method of claim 1, wherein the organic transistor is a transistor in low-gate architecture and wherein the semiconductor layer is deposited after the deposition of the source and drain electrodes.

7. The organic transistor manufacturing method of claim 1, wherein the laser etching is performed by means of a UV laser.

8. The organic transistor manufacturing method of claim 7, wherein the UV laser is an excimer laser.

9. The organic transistor manufacturing method of claim 1, wherein the dielectric layer is submitted to a crosslinking step.

10. The organic transistor manufacturing method of claim 9, wherein the crosslinking step to which the dielectric layer is submitted is performed by light or heat crosslinking.

11. The organic transistor manufacturing method of claim 1, wherein the laser-crosslinkable material appearing in non-crosslinked form is electrically insulating.

12. The organic transistor manufacturing method of claim 1, wherein the laser-crosslinkable material appearing in non-crosslinked form has a permittivity lower than 5.

13. The organic transistor manufacturing method of claim 1, wherein the laser-crosslinkable material appearing in non-crosslinked form comprises at least one of the following: polyacrylates, epoxy resins, epoxy acrylates, polyurethanes, silicons, polyimides and copolyimides, poly(sisesquioxane)s, poly(benzocyclobutene)s, poly(vinylcinnamate)s, perfluorinated aliphatic polymers, poly(vinylphenol).

14. The organic transistor manufacturing method of claim 1, wherein the crosslinking step is performed by light or heat crosslinking.

* * * * *